United States Patent [19]
Gaffney

[11] Patent Number: 5,446,334
[45] Date of Patent: Aug. 29, 1995

[54] PIEZOLUMINESCENT, PYROLUMINESCENT SENSOR

[75] Inventor: Edward S. Gaffney, Albuquerque, N. Mex.

[73] Assignee: GRE, Incorporated, Albuquerque, N. Mex.

[21] Appl. No.: 185,703

[22] Filed: Jan. 24, 1994

[51] Int. Cl.⁶ .................................. H01L 41/08
[52] U.S. Cl. ....................... 310/338; 310/311; 310/800; 250/338.3
[58] Field of Search ............... 310/311, 334, 338, 339, 310/800, 365, 366; 367/157; 250/338.2, 338.3, 338.4, 214 LA

[56] References Cited

U.S. PATENT DOCUMENTS

| | | | |
|---|---|---|---|
| 2,816,236 | 12/1957 | Rosen | 250/213 |
| 3,015,036 | 12/1961 | Butler | 250/213 |
| 3,035,177 | 5/1962 | Hanlet | 250/213 |
| 3,202,868 | 8/1965 | Blank | 315/55 |
| 3,432,724 | 3/1969 | Frost | 315/169 |
| 3,543,083 | 11/1970 | Sylvander | 315/55 |
| 3,780,572 | 12/1973 | Rocha | 73/67.5 R |
| 3,964,296 | 6/1976 | Matzuk | 73/67.5 R |
| 4,546,458 | 10/1985 | Cielo | 367/149 |
| 4,596,697 | 6/1986 | Ballato | 422/98 |
| 4,748,366 | 5/1988 | Taylor | 310/328 |
| 4,991,150 | 2/1991 | Wixom | 367/140 |
| 5,036,197 | 7/1991 | Voles | 250/338.3 |
| 5,193,911 | 3/1993 | Nix | 374/121 |
| 5,306,912 | 4/1994 | Sibbald et al. | 250/338.3 |
| 5,308,980 | 5/1994 | Barton | 250/338.4 |
| 5,354,982 | 10/1994 | Nelson et al. | 250/214 LA |

FOREIGN PATENT DOCUMENTS 0511907  8/1939  United Kingdom ............... 310/365

OTHER PUBLICATIONS

"The Strong Piezoelectricity in Polyvinylidene Fluoride (PVDF)" by N. Murayama et al., Ultrasonics, Jan. 1976, pp. 15–23.

Primary Examiner—Thomas M. Dougherty
Attorney, Agent, or Firm—John R. Lansdowne

[57] ABSTRACT

A mechanical/thermal stress transducer consisting of a piezo-pyroelectric material in electrical communication with a electroluminescent material, an electrode positioned between the piezo-pyroelectric material and the electroluminescent material forms the electrical communication at disjunct intervals so that the luminous intensity of light emitted by the electroluminescent material at any point is related to the mechanical/thermal stress acting at that point on the transducer. Selected applications of the transducer are included.

14 Claims, 4 Drawing Sheets

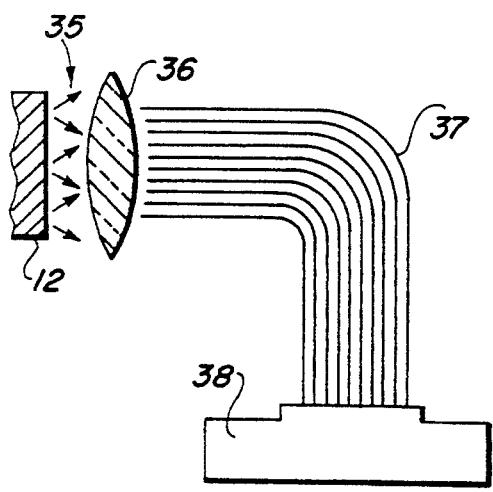
FIG_16
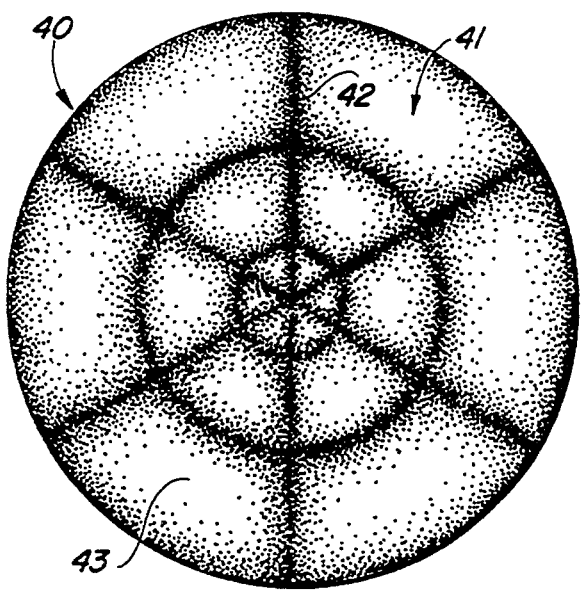
FIG_17
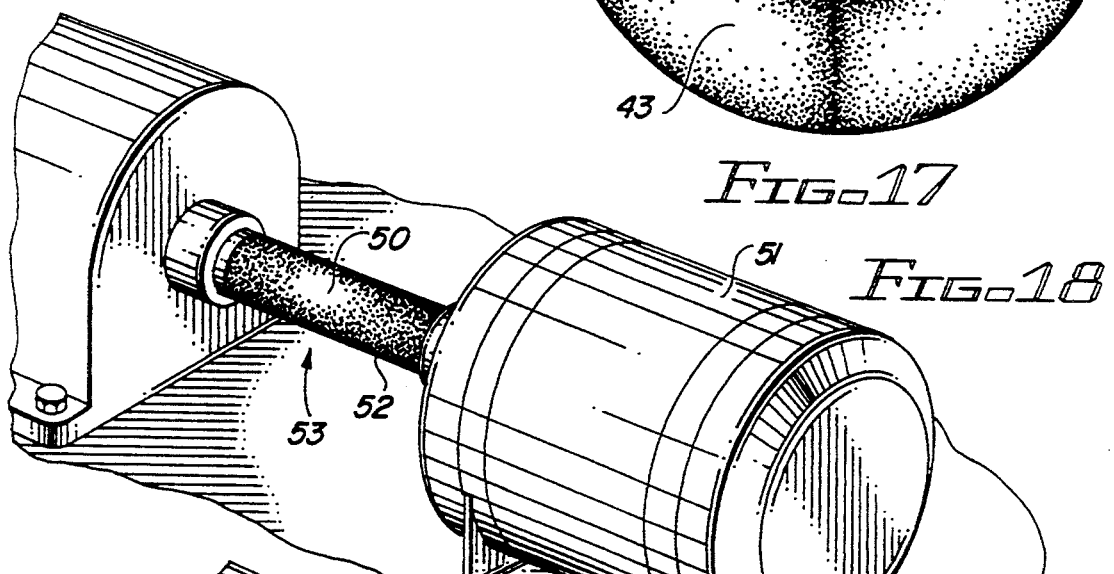
FIG_18
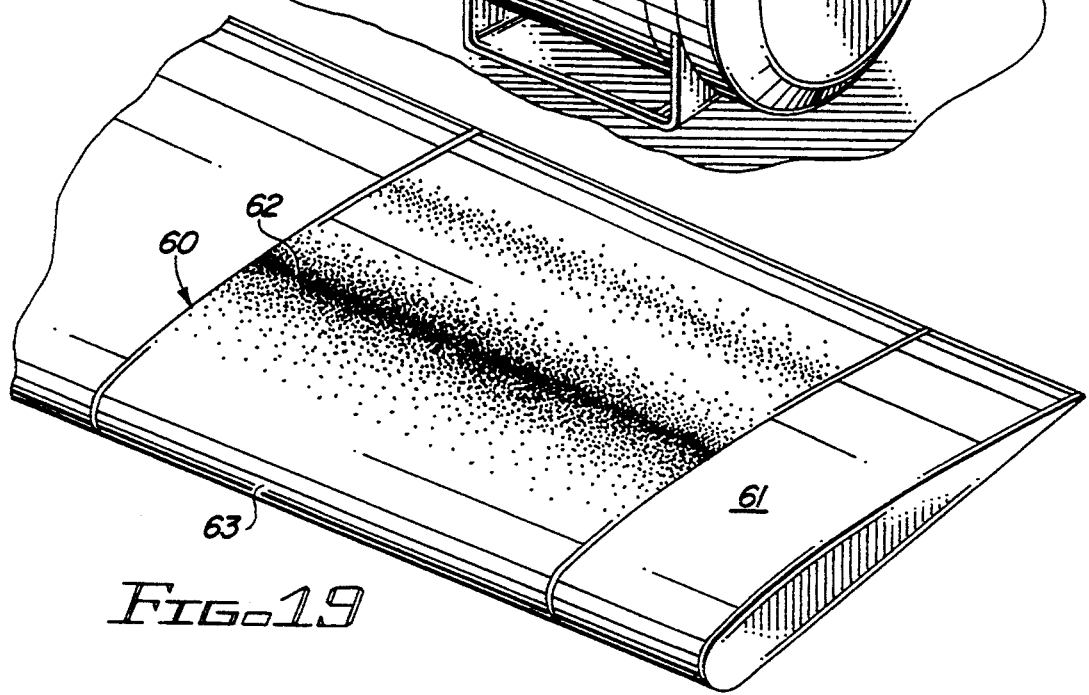
FIG_19

PIEZOLUMINESCENT, PYROLUMINESCENT SENSOR

BACKGROUND OF THE INVENTION

1. Field of the Invention

The present invention relates to the measurement of the distribution of thermal and/or mechanical stress over an area and, more particularly, to a mechanical/thermal stress transducer consisting of a piezo-pyroelectric material in electrical communication with a electroluminescent material, wherein an electrode positioned between the piezo-pyroelectric material and the electroluminescent material allows for electrical communication at disjunct intervals so that the luminous intensity of light emitted by the electroluminescent material at any point is related to the mechanical/thermal stress acting at that point on the transducer and distinct from stresses acting on adjacent points.

There are two types of materials which are useful for direct conversion of thermomechanical energy into electrical energy. Both of these materials will undergo a change in polarization when subjected to external stresses. One type consists of crystalline material in which the crystal structure possesses no center of symmetry. These materials have no net polarization when unstrained, but they respond to external stresses with internal strains which cause a separation of the center of positive charge from that of negative charge, thereby generating a dipole moment. When the external stresses are mechanical, such materials are properly termed piezoelectric. When the external stresses are thermal, such materials are properly termed pyroelectric. In general, a material which is piezoelectric will also be pyroelectric. An exception may occur when either type of response is vanishingly small.

The second type consists of material which has a spontaneous and reversible net polarization even in the absence of sustained external stresses. Such materials are properly termed ferroelectric. In response to external stresses, a ferroelectric material will change its net polarization. The difference between the two classes of material is that the ferroelectric material has a net polarization in the absence of external stresses whereas the piezoelectric or pyroelectric material is unpolarized in the absence of external stresses. As indicated by their ability to support a potential difference without an applied voltage, both classes are insulating materials under ordinary conditions.

Those experienced in the art refer to both the ferroelectric class of materials and the piezo- or pyroelectric class proper as "piezoelectric" or "pyroelectric" based on whether the primary stress effecting the change in polarization is mechanical or thermal, respectively. Since the response of either type of material is useful in the construction of transducers for thermomechanical stress and the response of the materials occurs under either mechanical or thermal stress, the term "piezopyroelectric" will be used hereafter to refer to either type of response. The abbreviation PPE will be used hereafter to refer to a piezo-pyroelectric material including ferroelectric materials.

Typical examples of PPE materials proper include quartz and tourmaline crystals. The ceramics lead zirconate-titanate (PZT) and barium titanate are typical of the ferroelectric materials. Another important type of ferroelectric material is the polymer ferroelectric, typified by poly(vinylidene fluoride), sometimes referred to as PVDF or PVF$_2$. Ferroelectric sheets consisting of minute crystals of piezoelectric ceramics embedded in a polymer have also been employed. Some relevant physical properties of typical PPE materials are listed in Table 1.

Electrical current is carried in a semiconductor either by electrons or by electron vacancies which are referred to as holes by those skilled in the art. A semiconductor diode is a device consisting of two or more semiconductor layers, at least one of which is a hole conductor. A light emitting diode, commonly abbreviated as LED, is a semiconductor diode which converts electrical energy into electromagnetic radiation at visible and near-infrared wavelengths.

Most of the LEDs currently in use are composed of inorganic crystals. Typical examples are germanium, gallium arsenide, and zinc sulfide. Such materials do not lend themselves to construction into large area devices. Recently, organic polymers such as poly(phenylene vinylene) and poly(cyanoterphthalylidene) have been reported to have been used in the construction of LEDs (Vincent et al., *Thin Film Solids*, 1982; Bradley, *J. Phys. D*, 1987; Nohara et al., *Chem.*

TABLE 1

| | Typical PPE material properties. | | | |
|---|---|---|---|---|
| Material | Density | Resistivity | $d_{33}$ | $p_{31}$ |
| Quartz | 2.65 | $10^{12}$ | 2.3 | — |
| PZT | 7.55 | $10^6$ | 245 | 275 |
| PVDF | 1.78 | $10^8$ | 20 | 40 |

Units:
Density, $10^3$ kilograms per (meter)$^3$ (Mg/m$^3$)
Resistivity, ohm-meters (Ωm)
$d_{33}$, $10^{-12}$ coulomb per newton (pC/N)
$p_3$  $10^{-6}$ coulomb per (meter)$^2$ per kelvin (μC/m$^2$/K)

*Lett.*, 1990; Braun and Heegar, *Appl. Phys. Lett.*, 1991; Grem et al., *Adv. Mater.*, 1992). These polymer LEDs may consist of a single layer of semiconducting material as just described or of several layers which transport only electrons, transport only holes, or are electroluminescent (Tang and vanSlyke, *J. Appl. Phys.*, 1987; Adachi et al., *Japan J. Appl. Phys.*, 1988a,b; Friend et al., *Phys. World*, 1992). The polymer diodes are often produced by methods which are consistent with production of large area devices. It is also fairly easy to change the material with ligands or dopants, a fact which leads to ready variations of photon energy and threshold voltage.

Recent advances have also identified transparent polymers which can be used as electrodes (Gustafsson et al., *Nature*, 1992). Previously, the transparent electrodes which permitted photon emission were composed of brittle materials. The new polymer electrodes allow the construction of flexible LEDs.

The drawbacks of existing transducers for measuring thermomechanical stress distributions fall into two categories. In the first category of drawback is their susceptibility to interference caused by electromagnetic fields in the environment in which they operate. The second category of drawback is that existing transducers are essentially devices for measurement of thermomechanical stresses at a single point or averaged over an area.

An exception to the second drawback is exemplified by the transducer in "night vision goggles" which consist of a sheet of pyroelectric material coupled to many individual solid state crystalline LEDs. The drawback of this device is that each LED must be individually mated with the pyroelectric sheet, which results in a device which is very uneconomical to construct.

2. Description of the Related Art

U.S. Pat. No. 4,748,366 discloses novel uses of piezoelectric materials for creating optical effects and describes a laminate combining a thin piezoelectric sheet with a thin sheet of an optical device. But these devices differ from the present invention in two fundamental ways. First, no method of separating the electrical output of one part of the piezoelectric sheet from another or the luminescent function of one part of the LED sheet from another is described, whereas the essence of the present invention is the separation of the response of one area from another. Second, the devices produce flashes when energized that are binary in their function, being either on or off. In contrast, the present invention specifically relies on the continuously variable nature of the light output of the LED sheet as the electrical output of the piezoelectric component changes.

U.S. Pat. No. 4,991,150 discloses an electroluminescent optical fiber shock sensor which specifically uses the continuously variable nature of the light output from an electroluminescent material. However, this device can measure only a single value of stress at a time. This value will be some average of the stress distribution acting over the entire surface of the transducer. No consideration is given to multiple stress measurements over a surface.

U.S. Pat. No. 5,193,911 discloses a thermal detector device which converts a spatial distribution of thermal energy into a multiplicity of electrical signals at each of a matrix of electrical terminals. This device illustrates the extreme difficulty of designing a thermal imaging detector from the paradigm of individual detectors located at very many points. Furthermore, the device would not operate well as a sensor for mechanical stresses because of its fragility. It consists of thin elements, including narrow strips, supported by posts. When subjected to many mechanical stress distributions of interest, deformations of these thin elements in response to inertial forces would cause the device to crack and/or tear before any useful signal could be obtained.

OBJECTS OF THE INVENTION

The objects of the present invention are:

1. To provide an apparatus for detecting discrete signals from separate portions of a single piezoelectric or pyroelectric sheet.
2. To provide an apparatus for measuring the spatial distribution of a transient thermomechanical stress over a surface;
3. To provide an apparatus for measuring the spatial distribution of a steady state thermomechanical stress over a surface;
4. To provide an apparatus for producing a visible image of the spatial distribution of a transient thermomechanical stress over a surface;
5. To provide an apparatus for producing a visible image of the spatial distribution of a steady state thermomechanical stress over a surface;
6. To provide an apparatus for converting spatial distributions of invisible radiation into visible images;
7. To provide an apparatus which is more economical to produce than presently available devices for converting spatial distributions of invisible radiation into visible images;
8. To provide an apparatus which has better spatial resolution than presently available devices for measuring the spatial distribution of transient or steady state thermomechanical stress over a surface;
9. To provide an apparatus which is easier to use than presently available devices for producing a visible image of the spatial distribution of transient or steady state thermomechanical stress over a surface; and
10. To provide an apparatus for producing a visible image of the distribution of pressure, radiation, energy, energy density, acceleration, vibration, or other parameters which can be related to the thermomechanical stress applied to a piezo-pyroelectric transducer.

Other objects, features, and characteristics of the present invention, as well as the methods of operation and functions of the related elements of operation and functions of the related elements of the structure, and the combination of parts and economies of manufacture, will become more apparent upon consideration of the following description and the appended claims with reference to the accompanying drawings, all of which form a part of this specification, wherein like reference numerals designate corresponding parts in the various figures.

BRIEF DESCRIPTION OF THE DRAWINGS

FIG. 16 illustrates schematically means by which light emitted by a transducer of the present invention may be transmitted to an optical system by means of a coherent optical fiber bundle.

FIG. 17 illustrates an application of the transducer of the present invention to produce a visible image of the vibration of the head of a drum.

FIG. 18 illustrates another application of the transducer of the present invention to produce an image of vibration in machinery.

FIG. 19 illustrates another application of the transducer of the present invention to measure aerodynamic pressures acting on an airfoil.

DETAILED DESCRIPTION OF THE PRESENTLY PREFERRED EMBODIMENTS

The transducer apparatus of the present invention comprises a layer of piezo-pyroelectric substance in intimate electrical contact with a layer of a electroluminescent substance which emits photons in response to the degree of electrical excitation received, and an electrode (or conducting layer) disposed between the layers to form the electrical contact at disjunct intervals; in accordance with which the light emitted from any point on the transducer is related to the mechanical/thermal stress acting on that part of the transducer.

Figure 1:
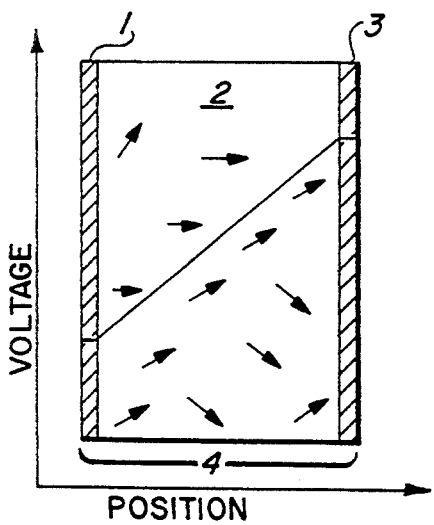
FIG. 1 is a graphic representation of the electrical polarization of an un-stressed transducer employing the piezo-pyroelectric effect.
Figure 2:
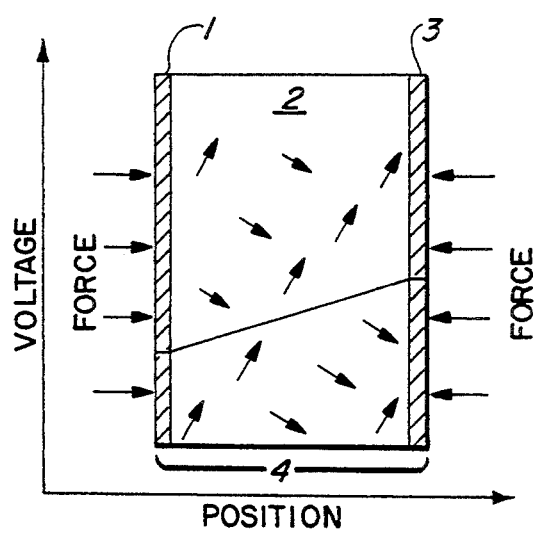
FIG. 2 is a graphic representation of the electrical polarization of a transducer caused by thermo-mechanical stresses on the piezo-pyroelectric material and producing a change in the electrical potential between opposing surfaces.
Figure 3:
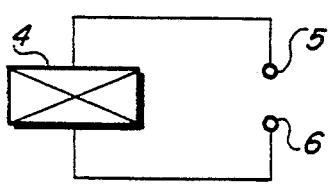
FIG. 3 is a schematic diagram of a transducer in the voltage mode of operation.
Figure 4:
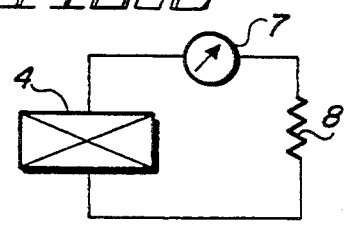
FIG. 4 is a schematic diagram of a transducer in the current mode of operation.

Referring now to FIGS. 1 and 2, in the construction of a transducer employing the piezo-pyroelectric effect, the changes in polarization caused by the thermomechanical stresses on the PPE material 2 produce a change in the electrical potential between opposing surfaces 1 and 3. When these surfaces are electrically isolated from each other, as shown schematically in FIG. 3, the applied stress on the transducer 4 can be determined by measuring the change of the difference in the electrical potential between the surfaces, as at the points 5 and 6. This mode of operation is termed the "high impedance" or "voltage" mode by those experienced in the art. When surfaces 1 and 3 are connected through an electrically resistive load, as shown schematically in FIG. 4, the applied stress is determined by measuring the current flowing through the resistive load 8 using an ammeter 7. This mode of operation is termed the "low impedance" or "current" mode by those experienced in the art.

Figure 5:
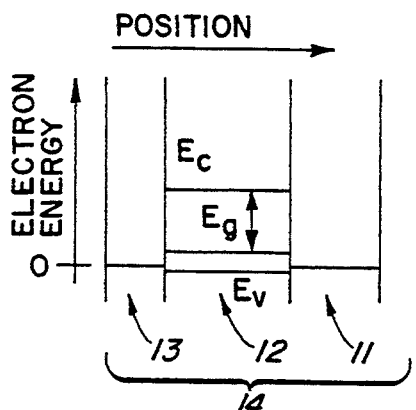
FIG. 5 is a graphic representation of the electron energy levels in a three layer semiconductor diode without any voltage bias.

The operation of a semiconductor diode may be explained by reference to FIGS. 5 and 6. FIG. 5 shows the energy states available to electrons in a three layer semiconductor diode 14 as a function of location on the horizontal axis. Electrons in the semiconductor 12 are ordinarily at a low energy, $E_v$, which is in reality a range of energy. This range is termed the "valence band" and can accommodate more electrons than are actually present. Electric current is carried in this material by the movement of this capacity for extra electrons or, in other words, by the movement of vacancies in the valence band which are called holes. No electrons can exist in this material with energies which lie between the valence band and a discrete higher energy level, $E_c$, called the "conduction band." In the absence of any externally imposed potentials, electrons from the ground electrode 11 are not able to migrate to the other electrode 13 because they do not have enough energy to enter the conduction band in the semiconductor. The result is a material with a very high electrical resistivity (on the order of $10^{8-10}$ Ωm).

Figure 6:
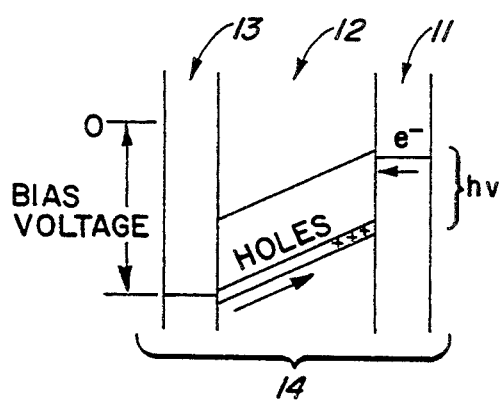
FIG. 6 is a graphic representation of the electron energy levels in a three layer semiconductor diode with a negative voltage bias.

Referring now to FIG. 6, when the semiconductor diode is subjected to a bias potential, the energy levels in the conductors 11 and 13 are held constant at values which differ by the amount of the bias voltage. Because the semiconductor material is a poor electrical conductor (resistivity on the order of $10^2$ Ωm for the polymer semiconductor material poly(phenylene vinylene), abbreviated PPV, even under the conditions shown in FIG. 6), a continuous potential difference is developed across it. When the bias reaches a threshold value, the electron energies in the ground electrode 11 are close enough to those of the electrons in the conduction band of the semiconductor 12 that thermal excitation permits them to enter the semiconductor. But if an electron enters the semiconductor from the ground electrode, it will be in the conduction band. Electrons in the conduction band are relatively immobile, and current in the semiconductor is carried primarily by holes. In order for current to flow, the electron must lose energy so that it can fill a vacancy in the valence band, in which the hole is said to be annihilated. One way this can occur is by the emission of a photon of energy $E_g$, where $E_g = E_c - E_v$ is the band gap energy. As a result of this energy loss, current can flow in one direction. As the potential is increased, the amount of current increases up to a fixed value, termed the "saturation current" by those experienced in the art. The voltage at which the saturation current occurs is called the "saturation voltage."

When the potential difference is of the opposite sign, no current can flow. In some semiconductor diodes, the band gap has an energy corresponding to the energy of photons of infrared or visible light. If the physical structure of the device permits these photons to be detected outside of the device, such a device is referred to as a light emitting diode, abbreviated as LED, by those experienced in the art. PPV can be made into a LED.

Figure 7:
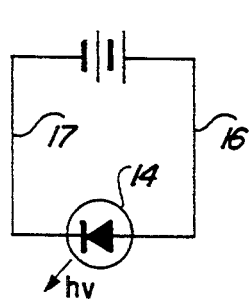
FIG. 7 is a schematic circuit intended to provide a DC bias to a light emitting diode.

An electrical schematic of an electrical circuit which could achieve the conducting state shown in FIG. 6 and cause light emission is presented in FIG. 7. The electrical circuit consists of a LED 14 emitting photons of energy $h\nu$ connected to the terminals of a battery 15 by two electrical conductors 16 and 17.

Figure 8:
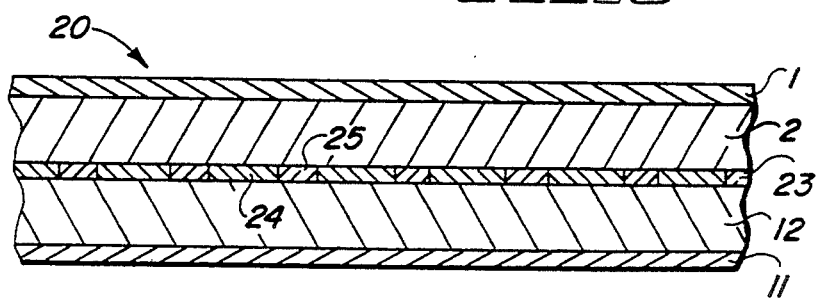
FIG. 8 is an elevation view in cross section of a transducer in accordance with the present invention.

The apparatus in the present invention combines a PPE member with a LED member to produce a transducer which converts distributions of thermomechanical stress into visible images wherein the luminous intensity at any point on the transducer is related to the amplitude of the thermomechanical stress acting on that part of the transducer. This device is referred to as a piezo-pyroluminescent (or PPL) sensor. A schematic cross-section of transducer in accordance with the present invention can be seen by reference to FIG. 8. The transducer consists of a continuous terminal of conducting material 1 on one surface of the PPE member 2, a LED member 12 on the other side of the PPE member, a second continuous terminal layer of conducting material 11 on the outer surface of the LED member, and an electrically conducting path connecting the two conducting sheets. The polarization of the PPE member must be oriented so that the thermomechanical stress to be measured will produce a potential difference of the correct sign to change the conductance of the LED member.

For emission to occur, the PPE member must be in intimate electrical contact with the LED member. This is accomplished by incorporating an electrode which consists of a layer of conducting material 23 between the PPE member 2 and the LED member 12, which conducting layer provides good electrical conduction from a point in the PPE layer 2 to a point directly opposite it in the LED layer 12 while simultaneously inhibiting electrical conduction between two such points which are separated laterally. Thus the electrical communication between the PPE member 1 and the LED member 12 is solely in the direction through and in the regions of individual isolated areas of the conducting material 14 and not in the adjacent regions in the plane of the electrode. Such an intermittent conducting layer between the PPE layer and the LED layer is further illustrated by reference to FIG. 9. This figure shows a conducting layer 23, which consists of isolated areas of conducting material 24 which are separated by nonconducting material 25. An equivalent configuration uses a continuous sheet of a material whose electrical conductivity is anisotropic, such as copper phthalocyanine or perylenetetracarboxilic dianhydride.

Referring again to FIG. 9, if the luminescence is to be viewed from the side of the PPL sensor adjacent to the LED member 12, then the terminal 11 must be of sufficient optical transparency to permit photons from the LED member 12 to escape. If, on the other hand, the output of the PPL sensor is to be viewed from the side with the PPE member 2, then the combination of the terminal 1, the PPE layer 2, and the conducting layer 23 must all be transparent.

Figure 9:
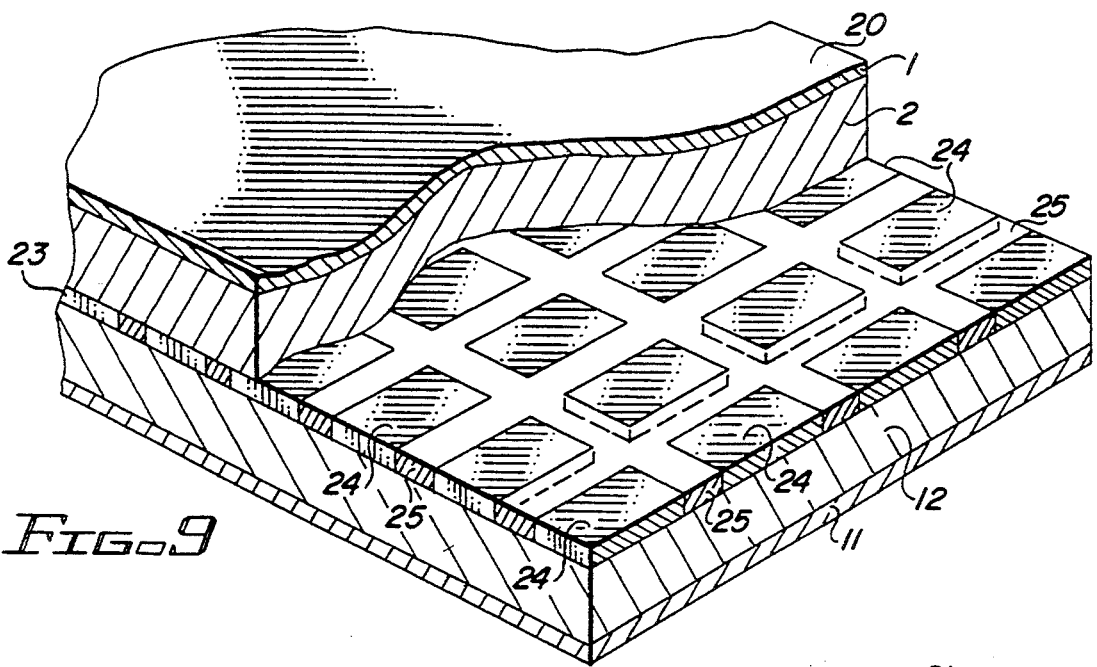
FIG. 9 is a partially cut away perspective view of a transducer in accordance with the present invention showing conducting and non-conducting elements of the conducting layer.
Figure 10:
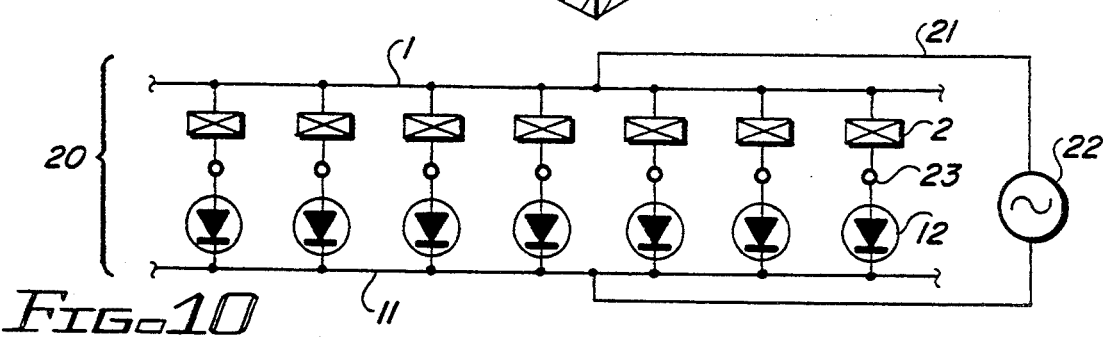
FIG. 10 is a schematic elevation view of the transducer as shown in FIGS. 8 and 9 and including a AC voltage bias.

Referring now to FIG. 10, the apparatus may also include a device to provide a bias potential across the conducting path. This figure presents an electrical schematic of the invention using an AC bias 22 connected by conductors 21 to the portion of the invention 20 which was illustrated in FIG. 8. A DC bias could also be used either in place of or in addition to the AC bias. The PPE layer 2 and LED layer 12 are represented by a series of symbols each of which consists of the electrical schematic symbol for a piezoelectric connected to the electrical schematic symbol for a LED to indicate the two dimensional array of separate devices which constitute the invention. The internal electrode is represented by the dots between the two types of symbols. Although FIGS. 8 and 10 each show a linear row of active elements, the invention is in fact a two-dimensional array as illustrated in FIG. 9.

The PPE member 2 responds to the amplitude of the thermomechanical stresses at each point on its surface by developing a potential difference between the two opposing faces of the member at that point. The terminal 1 maintains the potential on the surface of the PPE member 2 at a uniform value, but, because the PPE member is a good electrical insulator, the potential difference may vary from place to place on the surface adjacent to the LED member 12 or the internal electrode 23. The LED member responds to this variable potential by conducting current at current densities which vary from place to place in proportion to the variations of the potential generated by the PPE member. Thus the luminous intensity of the light emitted from any point on the transducer is related to the mechanical/thermal stress acting on that point, but it is not related to the stresses acting on other points on the transducer, including laterally adjacent points.

Figures 11, 12, 13:
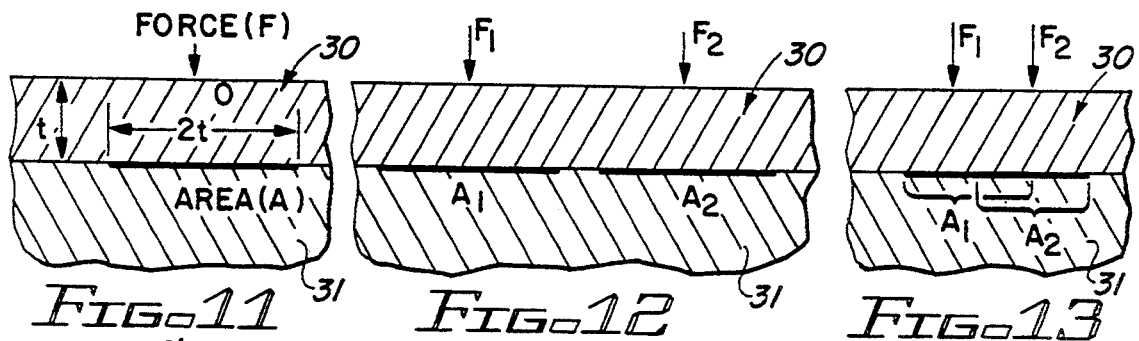
FIG. 11 illustrates the distribution of a force beneath an elastic layer supported by an elastic medium.
FIG. 12 illustrates the distribution of distinguishable forces beneath an elastic layer supported by an elastic medium.
FIG. 13 illustrates the distribution of indistinguishable forces beneath an elastic layer supported by an elastic medium.

The spatial resolution which is the essence of the PPL sensor of the present invention derives from two characteristics of the transducer. One is geometric, and the other depends on the electrical properties of the materials used in construction. Geometrically, the essential point is that the PPL sensor is thin. If a force is applied to a single point on the upper surface of a layer of material which rests on a medium, that force is spread over a finite area at any depth into the supporting medium. This is illustrated by reference to FIG. 11. In this figure, a force F is applied at the point O on the upper surface of a layer 30 which rests on a medium 31. At the interface between the layer and the medium, the force F is distributed over an area A. The exact distribution of such a force, which has been the subject of scholarly investigation for over a century, depends on the elastic properties of both the layer 30 and the medium 31. For purposes of illustration, it is sufficiently accurate to say that the area is of the order of $A = 4\pi t^2$, where t is the thickness of the layer 30. Referring now to FIG. 12, if two separate forces $F_1$ and $F_2$ are applied at two points separated by much more than 2t, they will be distributed, as illustrated in the figure, over two distinct areas $A_1$ and $A_2$ on the interface. Referring finally to FIG. 13, if two separate forces $F_1$ and $F_2$ are applied at points much closer than 2t, it will be impossible to distinguish the areas $A_1$ from $A_2$. For a thin PPE layer 30, on the order of several micrometers to a millimeter, charge distributions on its surface can be used to discriminate stress distributions with a spatial resolution on the order of micrometers to millimeters.

The effect of material properties on the spatial resolution of the PPL sensor can be understood by considering the case where the insulating portion 25 of the conducting layer 23 has the same electrical properties as the LED layer 12. The electrode between the LED member and the PPE member does not cover the entire interface between the two members. Rather, it consists of separate portions which are electrically isolated from each other, as illustrated in FIG. 9. As both the PPE member 2 and the LED member 12 in the nonconducting state are good electrical insulators (resistivity on the order of $10^8$ $\Omega$m), charge generated at one location on the interface by a thermomechanical stress will only be able to migrate a few nanometers to micrometers in a reasonable time. With the charge so localized on the interface, various parts of the LED member will experience individual potential differences across their thicknesses. The individual potential differences result in varying amounts of current and of luminescence. Thus, distinct stress levels acting on portions of the PPL sensor which are separated by more than this migration distance will cause distinct levels of luminescence from the LED member at the two separate locations.

Figure 14:
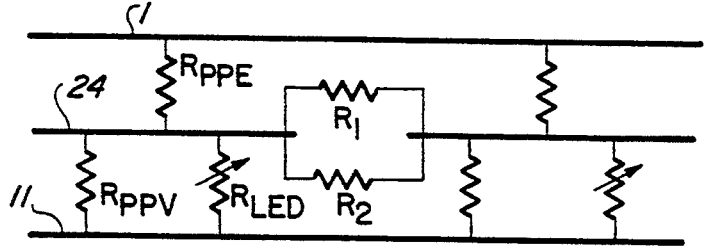
FIG. 14 is an electrical diagram showing a network of resistors representing the resistances of portions of a transducer in accordance with the present invention.

The flow of current in the PPL sensor can be explained by reference to FIG. 14. Disregarding any capacitive and inductive effects, which will only serve to further impede current, current will flow through a network of resistors. The resistance between an individual conducting element 24 of the conducting layer 23 and the external terminal 1 on the PPE member 2 will be given by $$R = \rho_{PPE} \times t_{PPE} \div A_{23}$$

where $\rho_{PPE}$ is the resistivity of the PPE material, $t_{PPE}$ is the thickness of the PPE layer, and $A_{23}$ is the area of the segment of the discontinuous electrode under consideration. Typical values are $10^8$ Ωm, $25 \times 10^{-6}$ m, and $62.5 \times 10^{-9}$ m², respectively. Thus $R_{PPE}$ is $40 \times 10^9$ Ω. The resistance of the LED is treated as two resistances in parallel. One, which we call $R_{PPV}$, is fixed at twice the resistance between the conducting element of the conducting layer 23 and the outer terminal 11 of the LED member 12 when the LED is in a nonconducting state. The other resistor, $R_{LED}$, is variable, ranging from the same value as the fixed resistor, $R_{PPV}$, when the bias voltage is at or below the threshold voltage to a value which is the resistance between the element of the conducting layer 23 and the outer terminal 11 of the LED member 12 when the LED is in a conducting state. $R_{LED}$ has the low value when the bias voltage is at or above the saturation level. Both $R_{PPV}$ and $R_{LED}$ are calculated using the formula $$R = \rho_{LED} \times t_{LED} \div A_{23}$$

where $\rho_{LED}$ is the resistivity of the LED material in the nonconducting or conducting state respectively, and $t_{LED}$ is the thickness of the LED member. Using the typical values of $10^8$ Ωm, 50 Ωm, and $100 \times 10^{-9}$ m, respectively, we find that $R_{PPV}$ is $160 \times 10^6$ Ω and $R_{LED}$ is 80Ω. In comparison to the resistances through the thickness of the piezoluminescent sheet, even in the nonconducting state of the LED, the resistances between separate segments of the discontinuous internal electrode will be very high. Referring again to FIG. 14, the resistance between segments may be calculated as the parallel sum of the resistance through the PPE material, which we designate as $R_1$, and the resistance through the LED material, which we designate as $R_2$. These may be calculated by $$R_{1,2} = \rho_{PPE,LED} \times \Delta \div (t_{PPE,LED} \times l_{23})$$

where $Z,900$ $\rho_{PPE,LED}$ is the resistivity of the material for the path we are calculating, $t_{PPE,LED}$ is the corresponding thickness, $\Delta$ is the distance between segments of the discontinuous electrode, and $l_{23}$ is the length of a side of the electrode segment. For square electrode segments, $l_{23}$ will be the square root of $A_{23}$. For the case we have taken, we find that $R_1$ is $4 \times 10^{11}$ Ω and $R_2$ is $10^{14}$ Ω. These are very large, even in comparison to the nonconducting resistance of the LED. For the rectilinear arrangement illustrated in FIG. 9, each conductive element 24 of the conducting layer 23 will have four neighboring elements, so the leakage currents between segments will only 1.6 percent for the nonconducting case and 80 parts per billion for the conducting case. We can see then that the response of each segment of the PPL sensor, as defined by the conductive elements 24 of the conducting layer 23, will respond individually.

The sensitivity of the PPL sensor can be controlled by altering the materials of the various members or by altering the thickness of the PPE member. The effect of changes of the PPE material can be inferred from the data of Table I. Variations in the value of $d_{33}$ or $p_3$ of over two orders of magnitude are possible with the materials listed. The ratio of piezoelectric output to pyroelectric output can also be selected. For an application where piezoelectric response is important but pyroelectric response is undesirable, the sensor can be made out of quartz, for example.

In addition to adjusting the sensitivity, the relation between voltage and charge can also be modified. One way to do this is to use different materials because the dielectric coefficient of the materials ranges from near 1 to over 1000. The voltage, V, produced in response to a pressure, $\sigma$ acting on a piezoelectric plate is given by $$V = \frac{t}{\epsilon} d_{33}\sigma$$

where t is the thickness of the plate, $\epsilon$ is the dielectric coefficient of the material, and $d_{33}$ is the piezoelectric constant. On the other hand, the charge per unit area depends only on the stress and the piezoelectric coefficient:

$$\frac{Q}{A} = d_{33}\sigma$$

Thus by selecting the material for the PPE layer, the ratio of charge density to voltage may be changed.

The sensitivity of the PPL sensor may also be modified by altering the area of overlap between the portion of external continuous terminal 1 of the PPE member 2 which is covered by a conductor with the area of the spots on the internal electrode. The external terminal 1 must be electrically continuous, but it need not cover the entire outer surface. By constructing the external terminal in the form of a narrow grid and using large areas on the conducting internal electrode one can construct a device which produces a relatively small optical output for a given thermomechanical input. This would be advantageous when an image is desired of the distribution of very strong thermomechanical stresses such as the shock waves produced by an explosion.

Figure 15:
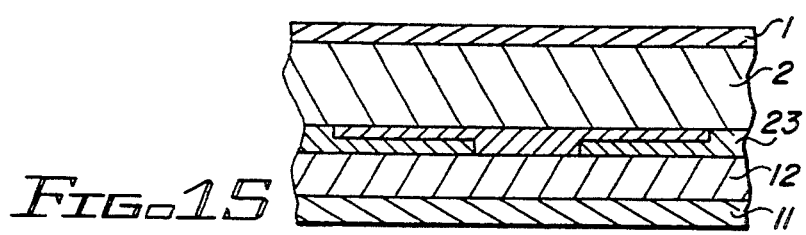
FIG. 15 is an illustration of structure to concentrate charge from a PPE member to a LED member.

Conversely, the discontinuous conducting elements 24 and the separating nonconducting elements 25 of the conducting layer 23 could be constructed as illustrated in FIG. 15, so as to concentrate charge from a large area of the PPE member 2 to pass through a small area of the LED member 12. The result would be intense emission from widely separated spots. This could be useful in producing observable luminescence levels from relatively weak thermomechanical stresses. Various grid patterns for the continuous electrode 11 can also be used to modify the sensitivity.

Referring again to FIG. 10, in an alternative embodiment of the present invention, a PPL sensor would employ a device 22 to produce an alternating current (AC) bias voltage of an amplitude that luminescence is just stimulated in the LED member at the peak of the voltage, but no luminescence occurs at lower voltages. Thus the LED member 12 will flash weakly and briefly at the frequency of the AC bias. Application of a steady stress on the PPE member 2 produces an additional potential difference which adds to the AC bias. In this new condition, the intensity and the duration of the luminescence at the peak of each bias voltage cycle is increased. The effect, if the frequency of the bias voltage is high enough (about 30 Hz for human visual perception) will be an increase in the observed level of steady luminescence. Alternatively, the polarity of the PPE member 2 could be reversed and the level of the AC bias set so that luminescence in the LED member 12 is just saturated when the AC bias voltage is at a minimum. In this case, the light level would decrease in response to a stimulus.

Referring now to FIG. 16, light 35 emitted from the LED member 12 can be imaged directly with lenses 36 or mirrors, or it can be transmitted by a coherent optical fiber bundle 37 to an optical system 38 and detected by appropriate means such as photography, cinematography or video recording.

One method of constructing a PPL sensor of the type described is to begin with a film of ferroelectric polymer which has been stretched and poled by known processes (e.g., see cited references 33–44 by Bloomfield and Marcus in T. T. Wang et al. (eds.) *The Applications of Ferroelectric Polymers*, 1988). The continuous terminal 1 is then deposited on one surface of the ferroelectric PPE member 2 by known methods such as vapor deposition or radio-frequency sputtering. The conducting layer 23 between the two members is then deposited on the other surface of the PPE member. If the luminescence is to be detected through this PPE member, the terminal and electrode must be transparent to visible radiation. For applications where the PPL sensor will not be bent or flexed, a material such as indium-tin oxide would be appropriate. For a flexible PPL sensor, a flexible transparent conductor such as poly(aniline) must be used. If individual electrode spots are small enough in diameter or equivalent dimension, on the order of one-tenth or less of the thickness of the piezoelectric member, it may be feasible to obtain flexibility with brittle indium-tin oxide spots, but the continuous terminal will have to be of flexible material. After deposition of this terminal 1 and the conducting layer 23, the LED member 12 is deposited on the side of the PPE member adjacent to the conducting layer using known methods, such as spin casting from a solution (described by Gustafsson et al., *Nature*, 1992). Finally, a continuous terminal 11 is deposited over the entire outer surface of the LED sheet, again using known methods. If necessary to protect sensitive components of the laminate from destructive elements in the environment, such as water or oxygen, an impervious coating such as ethyl vinyl alcohol may then be applied. Upon connection of the two outer continuous electrodes and a source of bias voltage, the PPL sensor will function as desired.

In an alternative method of manufacture, the PPE member 2 may be cast in a method as described immediately above for the LED member. In this case it will be cast onto an inert substrate which has already been coated with the outer continuous terminal 1. Poling of the piezoelectric sheet can be accomplished as it is deposited or at a later time using known methods.

The PPL sensor lends itself to numerous applications where it is desirable to learn of the location and intensity of mechanical and/or thermal stimuli on an object. This results from the nature of the materials used, specifically the PPE member, that they will generate a potential difference either when subjected to mechanical stresses or strains or when subjected to changes in temperature.

Referring now to FIG. 17, an example of the direct application of a PPL sensor is its use to form an image of the acoustic vibrations of an object such as a musical instrument. Illustrated is a drum 40. Application of a PPL sensor 41 to the head of the drum will cause the emission of a visible image corresponding to the vibratory patterns of the drum head. Those regions of the drum head which remain stationary, known as nodes 42, will appear dark whereas those regions which vibrate will be brighter with the brightest regions corresponding to the largest amplitude vibrations at the antinodes 43. Tuning of the instrument might have to be adjusted if the mass of the PPL sensor were significant relative to the vibrating member without the sensor applied.

Referring now to FIG. 18, the application of a PPL sensor 52 to a machine 51 with a rotating shaft 53 is illustrated. In such a use, the PPL sensor can identify regions of mechanical components of the machine which are producing the largest vibrations 50, as such regions will appear brightest on the PPL sensor.

Referring now to FIG. 19, an aeronautical application of the PPL sensor is illustrated, wherein a PPL sensor is employed to measure the distribution of aerodynamic pressure on a body caused by wind passing around the body. The PPL sensor 60 is applied to an airfoil surface 61 for which the aerodynamic pressure distribution is desired. Passage of wind over the airfoil surface will change the atmospheric pressure acting on the PPE sensor 60, resulting in luminescence from the LED member and a visible image of the pressure distribution. If operated in the forward sense, that is so that higher stresses produce greater optical output, regions of low pressure 62 will appear dark and regions of high pressure 63 will appear bright. The change in pressure of the air (or other gas) passing over the airfoil surface will cause a corresponding change in the temperature of the air. The initial image of the PPL sensor will primarily report on pressures being applied to the airfoil. However, if the flow is a steady flow, the image will eventually reflect both the pressure and the temperature in contact with the sensor. This will happen after a time sufficient for the temperature change to diffuse through the LED member and any other layers between the gas and the PPE member. If the PPL sensor is applied with the PPE member outermost, the effect of temperature will be sensed simultaneously with that of pressure.

Figure 20:
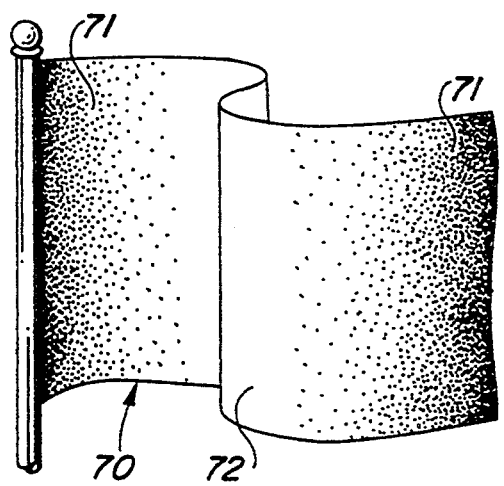
FIG. 20 illustrates another application of the transducer of the present invention to produce a visible image of motion of a flexible material such as a flag.

Referring now to FIG. 20, another application of a PPL sensor is illustrated, wherein a thin, flexible PPL sensor 70 is applied directly to fabric or a similar flexible substrate or is employed as a freestanding sheet so as to provide light emission in response to motion. This application has utility for safety applications, such as traffic control, and for display uses, such as for the flag as illustrated. The relatively unflexing regions 71 of the flexible PPL sensor sheet will appear dark, whereas more sharply bending regions 72 of the PPL sensor will glow brightly.

Figure 21:
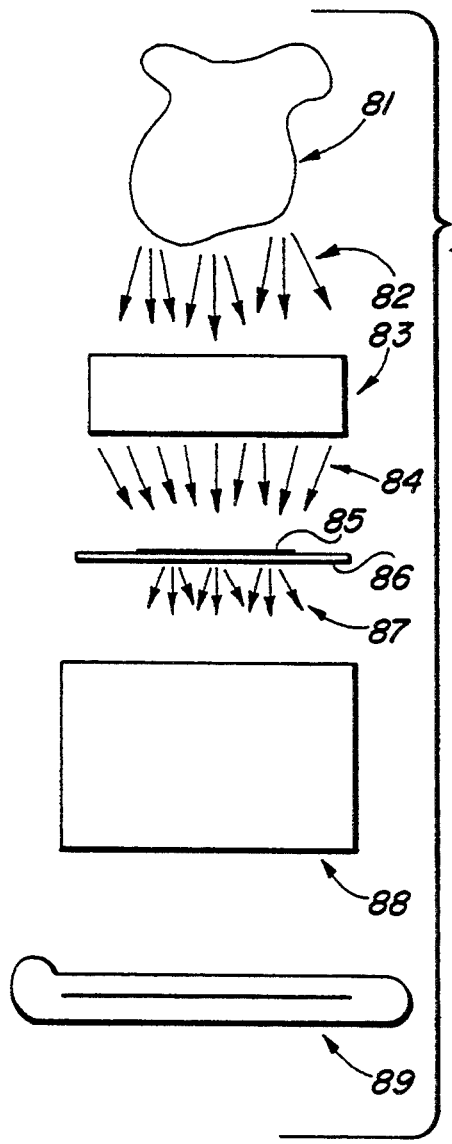
FIG. 21 illustrates schematically another application of the transducer of the present invention to produce a visible image of an object which emits energy that does not produce a visual response in humans.

Reference is now made to a final application of a PPL sensor as illustrated in FIG. 21. This figure illustrates a method of using a PPE sensor in conjunction with other components to produce a visible image of an object illuminated by or emitting invisible energy. For purposes of illustration, a device is described for producing an image of an object 81 which emits infrared energy 82 which does not excite a visual response in humans, but an alogous devices can be constructed where this energy may be acoustical, ultraviolet, x-rays, electrons or any other form which can be focused by an appropriate lens system 83. Prior to encountering the lens system, the energy is diverging. The lens system redirects the energy so that it is focused energy 84 which forms an image 85 on the PPE sensor 86. Such energy is typically incident on the side with the PPE member, although, for some applications, it may be advantageous to have the energy impinge on the luminescent side of the PPL sensor. The apparatus is completed by an optical imaging system 88 which collects light emitted 87 by the PPE sensor 86 and focusses it on an optical detection system 89, such as a photographic plate holder or similar device. The imaging system 88 and the optical detection system 89 may conveniently be combined, as in a camera or video recorder. For illustrative purposes, the apparatus shown in FIG. 21 is disposed in a linear manner, but folded arrangements with or without mirrors may also be used.

While the invention has been described in connection with what is presently considered to be the most practical and preferred embodiments, it is to be understood that the invention is not be limited to the disclosed embodiments, but on the contrary is intended to cover various modifications and equivalent arrangements included within the spirit and scope of the appended claims.

What is claimed is:

1. A mechanical/thermal stress transducer comprising:
   (a) a layer of a piezo-pyroelectric material;
   (b) a layer of a material which emits photons in response to the degree of electrical excitation received; and
   (c) an electrode forming electrical communication between the said layer of piezo-pyroelectric material and the said layer of material which emits photons in response to the degree of electrical excitation received at disjunct intervals solely in the regions of individual isolated areas of conducting material formed on said electrode and not in adjacent regions in the plane of said electrode, whereby the luminous intensity of the light at any point on the transducer is related to the mechanical/thermal stress acting on that part of the transducer.

2. The invention according to claim 1 wherein the said layer of a material which emits photons in response to the degree of electrical excitation received is an electroluminscent material.

3. The invention according to claim 2 wherein each respective area of conducting material engaging the piezo-pyroelectric material is greater than each respective area of conducting material engaging the electroluminescent material to concentrate charge from a large area of piezo-pyroelectric material to a smaller area of electroluminescent material.

4. The invention according to claim 2 wherein each respective area of conducting material engaging the piezo-pyroelectric material is smaller than each respective area of conducting material engaging the electroluminescent material to disperse charge from a small area of piezo-pyroelectric material to a larger area of electroluminescent material.

5. The invention according to claim 1 wherein the said piezo-pyroelectric material is selected from the group consisting of quartz, lead zirconate-titanate, barium titanate and polyvinylidene fluoride.

6. The invention according to claim 2 wherein the material of the said electroluminescent material is selected from the group consisting of germanium, gallium arsenide and zinc sulfide.

7. The invention according to claim 2 wherein the material of the said electroluminescent material is selected from the group consisting of electroluminescent polymers, poly(phynylene vinylene) and poly(cyanoterephthalylidene).

8. A system for producing a visible image of an object emitting energy which does not excite a visual response in humans comprising in combination:
   (a) a source of energy that does not excite a visual response in humans;
   (b) a system to redirect said energy to focused energy;
   (c) a mechanical/thermal stress transducer positioned to receive said focused energy and emit light in response to said energy received, said mechanical/thermal stress transducer comprising piezo-pyroelectric material and a single, continuous, and unitary layer of electroluminescent material, an electrode disposed between said piezo-pyroelectric material and said electroluminescent material and forming electrical communication therebetween at disjunct intervals; and
   (d) a source of electrical energy connected to said piezo-pyroelectric material and said electroluminescent material to provide an electrical bias to the said transducer whereby light is emitted from said electroluminescent material in proportion to said energy received.

9. A system for producing a visible image of the acoustic vibrations of an object comprising in combination:
   (a) an object that produces acoustic vibrations; and
   (b) a mechanical/thermal stress transducer secured to the vibrating area of said object, said transducer comprising a layer of piezo-pyroelectric material, a layer of electroluminescent material, and an electrode disposed between said layer of piezo-pyroelectric material and said layer of electroluminescent material, said electrode comprising a layer of insulating material including alternate areas of a conducting material, the said areas of conducting material forming electrical communication between said piezo-pyroelectric material and said electroluminescent material at disjunct intervals whereby a visual image is formed corresponding to the acoustic vibratory pattern of said object.

10. A system for producing a visible image of the vibrations of a component of a machine comprising in combination:
    (a) a machine having a component that vibrates; and
    (b) a mechanical/thermal stress transducer secured to said component, said mechanical/thermal stress transducer comprising a layer of piezo-pyroelectric material, a layer of electroluminescent material, and an electrode disposed between said layer of piezo-pyroelectric material and said layer of electroluminescent material, said electrode comprising a layer of insulating material including alternate areas of a conducting material, the said alternate areas of conducting material forming electrical communication between the said piezo-pyroelectric material and the said electroluminescent material at disjunct intervals whereby a visual image is formed of the vibration of said component.

11. A system to form a visible image of the strain distribution in a flexible body comprising in combination:
    (a) a flexible body subjected to strain; and
    (b) a mechanical/thermal stress transducer secured to said flexible body in the area exposed to said strain, said mechanical/thermal stress transducer comprising a layer of piezo-pyroelectric material, a layer of electroluminescent material, and an electrode disposed between said layer of piezo-pyroelectric material and said layer of electroluminescent material, said electrode comprising a layer of insulating material including alternate areas of a conducting material, the said areas of conducting material forming electrical communication between the said piezo-pyroelectric material and the said electroluminescent material at disjunct intervals whereby a visual image is formed of the strain distribution within said flexible body.

12. A system to form a visual image of the pressure distribution on a surface exposed to a moving fluid comprising in combination:
   (a) a surface exposed to a moving fluid; and
   (b) a mechanical/thermal stress transducer secured to said surface in the area exposed to said moving fluid, said mechanical/thermal stress transducer comprising a layer of piezo-pyroelectric material, a layer of electroluminescent material, and an electrode disposed between said layer of piezo-pyroelectric material and said layer of electroluminescent material, the said electrode comprising a layer of insulating material including alternate areas of conducting material, the said areas of conducting material forming electrical communication between said piezo-pyroelectric material and said electroluminescent material at disjunct intervals whereby a visual image is formed of the pressure distribution on said surface.

13. The invention according to claim 12, wherein the said moving fluid is a flow of air.

14. The invention according to claim 12, wherein the said moving fluid is water.

* * * * *